United States Patent [19]

Stone

[11] Patent Number: 5,160,901

[45] Date of Patent: Nov. 3, 1992

[54] MULTIMODE CRYSTAL OSCILLATOR

[75] Inventor: Charles S. Stone, Cedar Park, Tex.

[73] Assignee: Frequency Electronics, Inc., Mitchel Field, N.Y.

[21] Appl. No.: 581,672

[22] Filed: Sep. 13, 1990

[51] Int. Cl.[5] .................. H03B 5/36; H03B 21/01; H03B 25/00

[52] U.S. Cl. .................................. 331/37; 331/41; 331/43; 331/60; 331/116 R; 331/158; 331/176

[58] Field of Search .................. 331/37, 41, 42, 43, 331/60, 116 R, 116 FE, 158, 176

[56] References Cited

U.S. PATENT DOCUMENTS

| | | | |
|---|---|---|---|
| 3,826,931 | 7/1974 | Hammond | 331/163 X |
| 4,079,280 | 3/1978 | Kusters et al. | 331/37 X |
| 4,468,634 | 8/1984 | Takagi et al. | 331/60 |
| 4,740,761 | 4/1988 | Barnes et al. | 331/3 |
| 4,748,367 | 5/1988 | Bloch et al. | 310/343 |
| 4,839,613 | 6/1989 | Echols et al. | 331/69 |

OTHER PUBLICATIONS

Schodowski et al., "Resonator Self-Temperature-Sensing Using a Dual-Harmonic-Mode Crystal Oscillator", Pro. 43rd Ann. Symp. on Frequency Control, pp. 2-7, May 22-25, 1989.
Filler, Raymond L. Vig, John R., "Resonators for the Microcomputer Compensated Crystal Oscillator" Pro. 43rd Ann. Symp. on Frequency Control, pp. 8-15, May 22-25, 1989.
Bloch, Martin, Meirs, Marvin & Ho, John, "The Microcomputer Compensated Crystal Oscillator (MCXO)" Pro. 43rd Ann. Symp. on Frequency Control, pp. 16-19 May 22-25, 1989.
Benjaminson, A. & Stallings, S. C., "A Microcomputer-Compensated Crystal Oscillator Using a Dual-Mode Resonator" Pro. 43rd Ann. Symp. on Frequency Control, pp. 20-26, May 22-25, 1989.
Filler, R. L., Messina J. A. & Rosati, V. J., "Frequency-Temperature and Aging Performance of Microcomputer-Controlled Crystal Oscillators", Pro. 43rd Ann. Symp. on Frequency Control, pp. 27-33 May 22-25, 1989.
Bloch, Martin, Meirs, Marvin, Ho, John Vis. John R. & Schodowski, Stanley S., "Low Power Timekeeping", Pro. 43rd Ann. Symp. On Frequency Control, pp. 34-36 May 22-25, 1989.

Primary Examiner—Siegfried H. Grimm
Attorney, Agent, or Firm—Rosen, Dainow & Jacobs

[57] ABSTRACT

A multimode oscillator is disclosed which employs a single gain feedback loop for exciting at least two modes of a resonator to cause the oscillator to oscillate simultaneously at at least two frequencies. The multimode oscillator comprises the resonator, an amplifier to provide gain at the appropriate operating frequencies to support simultaneous oscillation at such frequencies and an equalizing network with amplitude and phase characteristics versus frequency to support the simultaneous modes of oscillation. The single loop oscillator permits separate control of the two simultaneous different frequencies of oscillation. In order to minimize thermal hysteresis, at least the active portion of the feedback loop does not include inductors. In some applications, the multimode oscillator may include one or more rejection networks to suppress unwanted oscillations. The useful outputs of the multimode oscillator are one or more of the operating frequencies, harmonics and intermodulation products. In one specific embodiment, one output is at the frequency of the fundamental C-mode resonance of an SC-cut lateral field quartz crystal, and a second output is at the beat frequency between the third harmonic of that fundamental and the third overtone. The beat frequency is a measurement of effects, such as temperature, upon the frequencies of operation of the oscillator.

16 Claims, 3 Drawing Sheets

MULTIMODE CRYSTAL OSCILLATOR

BACKGROUND OF THE INVENTION

The invention disclosed herein relates to frequency and time generators and standards, to control thereof and to thermometry, barometery and other fields of measurement and instrumentation. More particularly, the invention relates to multimode oscillators, control thereof and to use thereof in frequency and time generators and standards and in thermometry, barometery and other fields of measurement and instrumentation.

The subject of dual-mode oscillators including crystal resonators which simultaneously energize, excite or stress two modes of the crystal resonator and simultaneously generate two frequencies is discussed in the literature. For example, such oscillators utilizing an SC-cut quartz crystal energized in the dual C mode were extensively discussed at the 43rd Annual Symposium on Frequency Control (May 22-25, 1989). See, for example, the following. Schodowski, Stanley S., "Resonator Self-Temperature-Sensing Using a Dual-Harmonic-Mode Crystal Oscillator", *Pro. 43rd Ann. Symp. on Frequency Control*, pp. 2-7; Filler, Raymond L. & Vig, John R., "Resonators for the Microcomputer Compensated Crystal Oscillator", *Pro. 43rd Ann. Symp. on Frequency Control*, pp. 8-15; Bloch, Martin, Meirs, Marvin & Ho, John, "The Microcomputer Compensated Crystal Oscillator (MCXO)", *Pro. 43rd Ann. Symp. on Frequency Control*, pp. 16-19; Benjaminson, A. & Stallings, S. C., "A Microcomputer-Compensated Crystal Oscillator Using A Dual-Mode Resonator", *Pro. 43rd Ann. Symp. on Frequency Control*, pp. 20-26; Filler, R. L., Messina, J. A. & Rosati, V. J., "Frequency-Temperature and Aging Performance of Microcomputer-Controlled Crystal Oscillators", *Pro. 43rd Ann. Symp. on Frequency Control*, pp. 27-33; Bloch, Martin, Meirs, Marvin, Ho, John, Vig, John R. & Schodowski, Stanley S., "Low Power Timekeeping", *Pro. 43rd Ann. Symp. on Frequency Control*, pp. 34-36.

*Pro. 43rd Ann. Symp. on Frequency Control*, pp. 2-7, cited above, describes double gain loop and single gain loop dual-mode oscillators capable of simultaneously generating two SC-cut C-mode frequencies. The double gain loop oscillator is described as two separate oscillators sharing a crystal that operates at series resonance, a condition obtained with series or parallel tuned networks that include both capacitors and inductors. Additional circuitry such as a frequency tripler, mixer and low pass filter may also be needed. This double gain loop oscillator has the disadvantages of employing a relatively large number of parts and employing inductors. Inductors exhibit hysteresis effects, require a relatively large amount of space and are difficult to form in integrated circuits as compared to other components such as capacitors.

The single gain loop, Colpitts-type oscillator described in *Pro. 43rd Ann. Symp. on Frequency Control*, pp. 2-7, also employs capacitors and inductors to provide the correct phase shift for oscillation at the two C-mode frequencies, and to suppress an unwanted B-mode frequency. The inherent non-linearity in a transistor provides for multiplication and mixing of the two C-mode frequencies to produce a beat frequency. A signal at the beat frequency and a signal at one of the two C-mode frequencies are provided as outputs from the oscillator. Although this single gain loop oscillator requires less input power and fewer components than the double gain loop oscillator described above, the single gain loop oscillator has the drawback that it does not permit separate control of the two crystal-mode currents (power), requires a singly or doubly selective amplifier and a low pass filter at its outputs, and also requires inductors.

*Pro. 43rd Ann. Symp. on Frequency Control*, pp. 20-26 discusses the need for the inductors in a double gain loop SC-cut dual mode oscillator. Also, when perpendicular field excitation resonators are employed, it is commonplace to employ narrowly tuned rejection networks or traps to prevent oscillation at unwanted frequencies; such traps ordinarily incorporate one or more inductors.

One use for such dual mode oscillators described in the literature is to provide compensation for microcomputer-controlled crystal oscillators, particularly temperature compensation. Temperature stability of crystal-controlled oscillators was frequently attempted by placing the crystal in an oven. See, for example, U.S. Pat. No. 4,748,367 (Bloch et al.), assigned to the assignee of this application, and U.S. Pat. No. 4,839,613 (Echols et al.). One problem associated with oscillators employing ovens is that such oscillators are not suitable for low power applications.

SUMMARY OF THE INVENTION

It is an object of the invention disclosed herein to improve the construction and/or performance of frequency and time generators and standards.

It is another object of the invention to improve the construction and/or performance of multimode oscillators.

It is another object of the invention to provide a multi-mode oscillator which does not have the drawbacks of the dual mode oscillators described above.

It is another object of the invention to provide a multi-mode oscillator having a reduced number of components.

It is another object of the invention to provide a multi-mode oscillator having relatively high power at least two simultaneous frequencies of oscillation while providing separate control of the power of oscillation at each frequency.

It is another object of the invention to provide a multi-mode oscillator having relatively high power at least two simultaneous frequencies of oscillation, which is inductorless at the desired frequencies of oscillation, or which does not employ inductors at all.

It is another object of the invention to provide a multi-mode oscillator having a reduced number of components which allows separate control of oscillation at each of at least two simultaneous frequencies of oscillation.

It is another object of the invention to provide a multi-mode oscillator having relatively high power at least two simultaneous frequencies of oscillation, with a reduced number of components, without inductors at all or inductorless at the desired frequencies, and which allows separate control of oscillation at the at least two frequencies.

In the specific case of a lateral field type of SC-cut crystal resonator, applicant recognized that such resonators suppressed the "B" and all other undesired modes from well below a desired fundamental "C" mode frequency to well above a desired third overtone "C" mode frequency. Applicant further recognized that the feedback loop of a control circuit for such a lateral field type of SC-cut resonator could be designed so that it did not include narrow rejection networks (or traps) and any inductors that such networks normally include, thereby eliminating the need for inductors in a multimode oscillator employing such a resonator.

The applicant further recognized that in the case of resonators which did not suppress unwanted modes such as the "B" mode in a perpendicular field SC-cut crystal resonator, a control circuit of the type referred to above in connection with the lateral field SC-cut crystal resonator may not be sufficient to suppress such unwanted modes. In such a case, the applicant further recognized that the feedback loop of the control circuit for such a resonator may be designed to include one or more narrow rejection networks and yet provide for separate control of oscillations at more than one frequency. Such rejection networks may include one or more inductors; however, such rejection networks may be constructed so that they are active only in preventing undesired oscillations and are inactive at the desired frequencies of oscillation. Hence, the feedback loop would be substantially inductorless at the desired frequencies of oscillation even with rejection networks.

Some or all of the above objects, and other objects, are achieved by a multimode oscillator according to the invention which includes a multimode resonator and a control circuit comprising a single gain feedback loop for causing and/or sustaining at least two different simultaneous frequencies of oscillation, thereby reducing the number of components, and which allows for separate control of oscillation (e.g. power) at the two frequencies.

Some or all of the above objects, and other objects, are achieved by a multimode oscillator according to the invention which comprises a multimode resonator and a control circuit comprising a single gain feedback loop for causing and/or sustaining at least two different simultaneous frequencies of oscillation in which the feedback loop is inductorless at the desired frequencies of oscillation. Preferably, the feedback loop does not include inductors at all.

The control circuit may include one or more rejection networks which are not active at the mode frequencies desired of the multimode resonator or at the operating frequencies of the oscillator, but are present instead to prevent oscillation at unwanted frequencies (such as, for example, the "B" modes of resonance in an SC-cut type of perpendicular field quartz crystal resonator). Such rejection networks may comprise, in discrete or distributed form, connected in series and/or parallel, resistance, capacitance, inductance, and amplifier stage input and output impedances. Such rejection networks may be incorporated in the amplifier or elsewhere in the feedback loop.

The invention thus provides the design freedom of separate control of excitation of each of two resonator modes, thereby permitting separate control of, for example, the oscillating power at each frequency. The invention also either eliminates inductors from the active feedback loop (i.e., the portion of the feedback loop active at the desired frequencies of oscillation), or eliminates all inductors from the feedback loop altogether. Inductors can be major contributors to thermal hysteresis effects on frequency; therefore, an oscillator having an inductorless active feedback loop will have less thermal hysteresis effect. The presence of inductors in circuits makes it difficult to microminiaturize or package such circuits, and difficult or impossible to form such circuits as integrated circuits; therefore, a feedback loop for an oscillator which does not include inductors is easier to manufacture and package.

The control circuit may realize in a useful first output a first frequency of a first desired mode of resonance of a multimode resonator, and concurrently realize a second frequency of a second desired mode of resonance of the multimode resonator. In one embodiment, a heterodyne beat (third) frequency is derived from the frequencies of the two different simultaneously present modes by, for example, mixing, either within the control circuit or in another circuit. This may also be accomplished without inductors.

According to one embodiment, the feedback loop of the control circuit includes an amplifier which provides gain at the appropriate operating frequencies to support simultaneous oscillations at such frequencies, and an equalizing network with amplitude and phase characteristics versus frequency to support the desired simultaneous modes of oscillation. In another embodiment, one or more rejection networks are included to suppress oscillation in unwanted modes. The amplifier is sufficiently broadband to support simultaneous oscillation at the at least two frequencies, and includes at least one non-linear stage or portion, and may include other linear or non-linear portions or stages, or both. A non-linear amplifier or device may also be provided outside the feedback loop. The required non-linear stage or portion may be the input stage of the amplifier, whether the amplifier be of single-stage or multi-stage architecture, or any other stage should the amplifier be of multistage construction.

In a preferred embodiment, the amplifier non-linearity causes conduction in support of amplification of each oscillation mode to be in short pulses such that the interaction of such pulses produces intermodulation products to provide an oscillation at the third frequency which may be provided as a useful output.

In a specific embodiment, the amplifier produces intermodulation products including Fourier components at frequencies that may be expressed as $N*f_Q +/- P*f_R$, where N and P are positive integers, and $f_Q$ and $f_R$ are odd-order overtones of the multimode resonator which may include the fundamental "f" at which the oscillator may be operating (and in particular that intermodulation product having a frequency defined by N=3 and P=1, Q=1 and R=3 which may be used for dual mode self-thermometry of an SC-cut lateral field quartz crystal resonator). Preferably, the nature of the amplifier non-linearity is such that conduction is cut off when the sum of the two or more mode different frequency oscillations is below a certain threshold, and square-law, polynomial, or exponential with respect to the sum of the two or more oscillations when that sum is above the threshold such that no desired mode may predominate over and thereby suppress another desired mode.

The equalizing network compensates for the differences among insertion losses of the multimode resonator and gains of the amplifier at the various frequencies of simultaneous oscillation. The equalizing network may be at the input or output of the ampifier, or distributed between the input and output or in the intermediate stages, or in any combination.

In the preferred embodiment, the oscillator is a dual mode oscillator which comprises an SC-cut lateral-field quartz resonator with suppressed B-modes and desired fundamental and third overtone C-modes, and a single gain oscillatory feedback loop for the fundamental and third overtone C-modes, which comprises a discrete or distributed equalizing network without inductors, a first amplifier and a second amplifier. One of the two amplifiers is non-linear as described above and each is broadband amplifying at both the desired fundamental and third overtone C-mode frequencies. The resonator, the network and the amplifiers may be coupled in any order in a positive-feedback loop that is simultaneously self-oscillating at the fundamental mode and at the third overtone mode of the resonator.

The intermodulation products obtained from simultaneous presence and superposition of the desired mode frequency oscillations in the non-linear amplifier, including but not limited to any intermodulation product at the frequency $3*f_1-f_3$, may be used for thermometry or self-thermometry of an SC-cut lateral field quartz crystal resonator, or for other sensing or transduction purposes to which the resonator may be suited.

The above and other objects, aspects, features and advantages of the invention will be more readily perceived from the following description of the preferred embodiments thereof taken with the accompanying drawings and appended claims.

BRIEF DESCRIPTION OF THE DRAWINGS

The invention is illustrated by way of example and not limitation in the figures of the accompanying drawings in which like numbers indicate like or corresponding parts, and in which.

DESCRIPTION OF THE PREFERRED EMBODIMENTS

Figure 1:
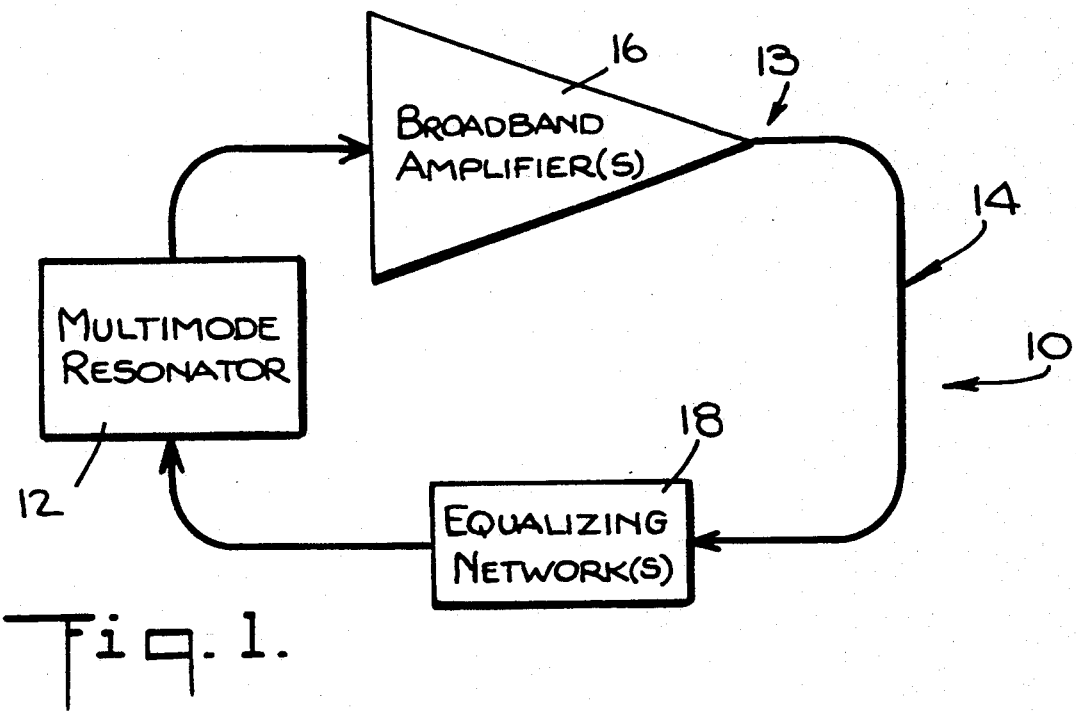
FIG. 1 is a block diagram of a dual mode oscillator according to the invention.

Referring to FIG. 1, multimode oscillator 10 according to the invention comprises a multimode resonator 12 and a control circuit 13 therefor including a single gain feedback loop 14. Multimode resonator 12 is preferably a crystal resonator such as an SC-cut lateral field quartz crystal resonator, but may be an AT-cut or other cut or field (e.g., perpendicular or thickness field) quartz or other crystal resonator capable of being simultaneously excited or energized in at least two vibrational modes, including specifically an SC-cut perpendicular field crystal resonator.

Control circuit 13 and resonator 12 cooperate to provide oscillations simultaneously at two or more frequencies. Feedback loop 14 includes an amplifier or amplifiers 16 which may include one or more stages, and an equalizing network or networks 18. Equalizing network 18 has amplitude and phase characteristics versus frequency to support the desired simultaneous modes of oscillation, i.e., equalizing network 18 permits multimode resonator 12 to be excited, energized or stressed in at least two modes simultaneously, and with amplifier 16 induces at least two simultaneous oscillations at different frequencies corresponding to the at least two excited modes of the multimode resonator. Equalizing network 18 also compensates the differences among insertion losses of the multimode resonator and gains of the amplifier 16 at the various frequencies of simultaneous oscillation.

Amplifier 16 provides gain at the appropriate operating frequencies to support simultaneous oscillations at such frequencies. Amplifier 16 and/or equalizing network 18 may also include, if necessary, means such as rejection networks or traps for suppressing unwanted oscillations. Amplifier 16 includes one or more inverting or non-inverting non-linear stages or portions, thereby producing harmonics and intermodulation products from the at least two simultaneous different frequency oscillations. Amplifier 16 may also include one or more inverting or non-inverting linear stages or portions. Useful outputs at frequencies such as the fundamental, a harmonic of the fundamental, an overtone, and/or a beat may be taken from the loop as appropriate to the application. Alternatively, a secondary non-linear amplifier or amplifier stage may be provided in control circuit 13 outside of loop 14, and the fundamental and/or a harmonic of the fundamental may be taken from loop 14 and harmonics, intermodulation products, and/or beats taken from the external non-linear amplifier.

The ordering of amplifier 16 and network 18 may be reversed, portions of amplifier 16 and network 18 may be distributed between amplifier 16 and network 18, and network(s) and amplifier(s) could be subdivided into sub-networks and amplifier stages consistent with a given direction of signal flow such as indicated in FIG. 1, or the reverse.

Figure 2:
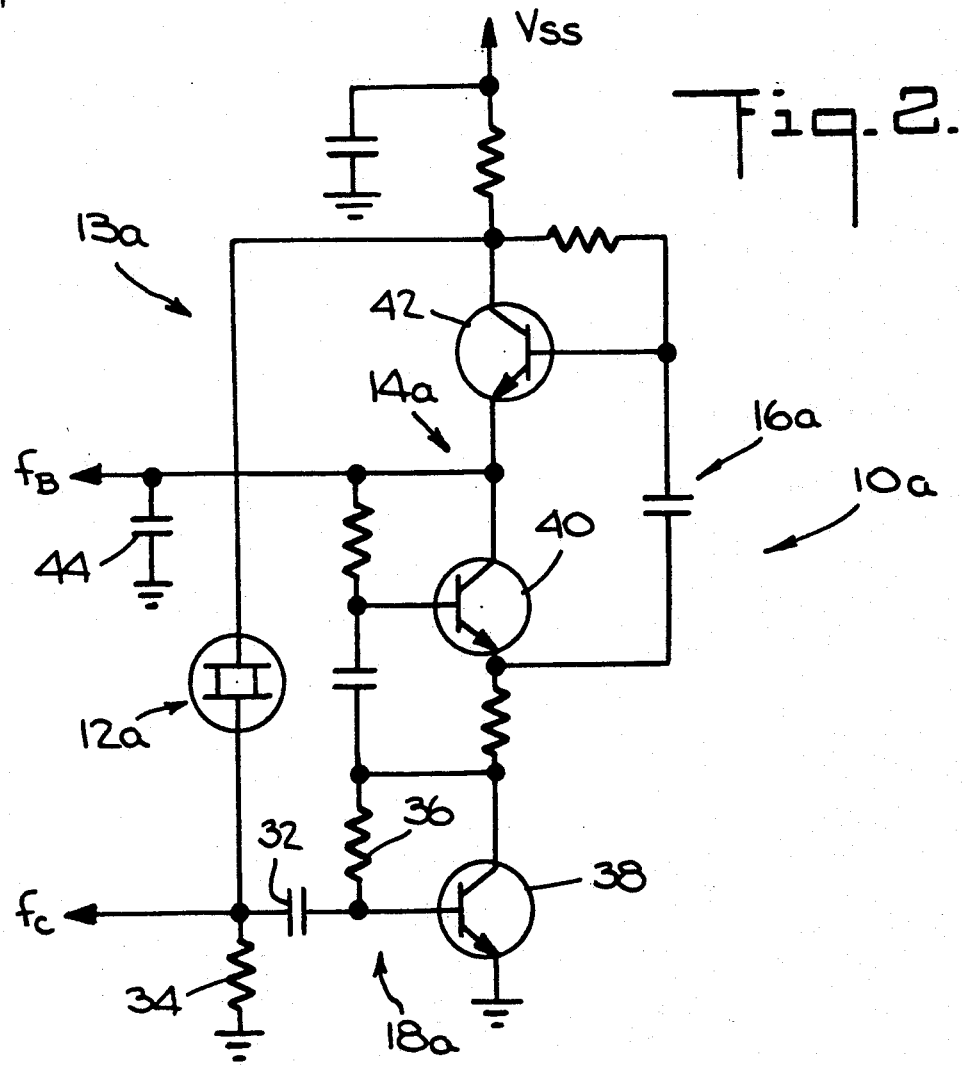
FIG. 2 is a schematic circuit diagram of the dual mode oscillator of FIG. 1.

Referring to FIG. 2, dual mode oscillator 10a according to the invention comprises an SC-cut lateral field quartz crystal resonator 12a as the multimode resonator 12 of FIG. 1. SC-cut lateral field quartz crystal resonator 12a has a suppressed B-mode and all other undesired modes from well below the fundamental "C" mode frequency $f_1$ to well above the third overtone "C" mode frequency $f_3$, and is capable of simultaneous narrow (high Q) oscillations at the $f_1$ and $f_3$ frequencies. Such SC-cut crystal resonators are known in the art. See, for example, U.S. Pat. No. 4,701,661 of Warner et al., which is assigned to the assignee of this application.

Dual mode oscillator 10a of FIG. 2 comprises a control circuit 13a having a single gain feedback loop 14a that does not include inductors. Loop 14a includes equalizing network 18a which comprises a high-quality capacitor 32, load resistance 34, feedback resistance 36 and bipolar transistor 38. Capacitor 32 forms a frequency-variant equalizing network with load resistance 34 and augmented feedback resistance 36. Bipolar transistor 38 is connected as a linear common-emitter feedback stage. Network 18a and SC-cut quartz crystal resonator 12a cooperate to simultaneously produce oscillations at the fundamental frequency $f_1$ and third overtone frequency $f_3$.

Loop 14a of dual mode oscillator 10a of FIG. 2 also includes amplifier 16a which comprises bipolar transistor 40 and bipolar transistor 42. In addition to fostering simultaneously stable oscillations at the fundamental and third overtone desired resonator modes, transistor 42 is connected as a non-linear, common-emitter stage and transistor 40 is connected as a linear emitter follower to enhance the non-linear behavior of non-linear transistor 42. Transistor 42 beats the fundamental and third overtone frequencies to produce a signal at a third frequency, which is useful, for example, in thermometry.

In steady-state operation, feedback from the collector of transistor 40 through first and third overtone modes of quartz crystal resonator 12a results in approximately equal loop gains at the two mode frequencies due to the net effects of the resonator mode resistance being higher at the third overtone, higher compensation from equalizing network 18a transmission at the third overtone through capacitor 32 into the base of transistor 38, and higher non-linear stage gain at transistor 40 (due to the bypass characteristics of capacitor 44 at the third harmonic). Conduction in transistor 42 in support of dual-mode oscillation occurs in short pulses when the two mode frequency signals from transistor 40 are not destructively interfering, thereby creating a heterodyne beat frequency signal at a (third) frequency of $3f_1-f_3$, which is a signal at relatively low frequency and is therefore poorly bypassed by capacitor 44, thus appearing across capacitor 44 at a useful level. Preferably, the nature of the amplifier non-linearity is that conduction is cut off when the sum of the two simultaneous different frequency oscillations is below a certain threshold, and square-law, polynomial, or exponential with respect to the sum of the two or more oscillations when that sum is above the threshold, thus assuring that no desired modes may predominate over and thereby suppress another desired mode. In the preferred embodiment of FIG. 2, conduction is exponential when the sum of the oscillations is above the threshold.

The two C-mode frequencies appear simultaneously in a voltage at the output designated $f_c$ at a useful level. The desired mode output may be isolated from this point by auxiliary filtering.

Preferably, amplifier 16a produces intermodulation products including Fourier components at frequencies that may be expressed as $N*f_Q+/-P*f_R$, where N and P are positive integers, and $f_Q$ and $f_R$ are odd-order overtones of the SC-cut quartz crystal multimode resonator 12a which may include the fundamental f at which oscillator 10a may be operating (and in particular that intermodulation product having frequency defined by $N=3$ and $P=1$, $Q=1$ and $R=3$ which may be used for dual mode self-thermometry of the quartz crystal resonator 12a).

With respect to a dual mode oscillator 10a which includes an SC-cut lateral field quartz crystal resonator 12a, the second output (third frequency), which is the beat frequency between the third harmonic of the fundamental and the third overtone, is a measurement of effects (such as temperature which are derived from known properties of the quartz crystal resonator) upon frequencies of operation of the oscillator.

While the preferred embodiment of FIG. 2 employs bipolar transistors for amplifier stages and in the equalizing network, other embodiments may employ other types of devices, for example, field-effect transistors.

Figure 3:
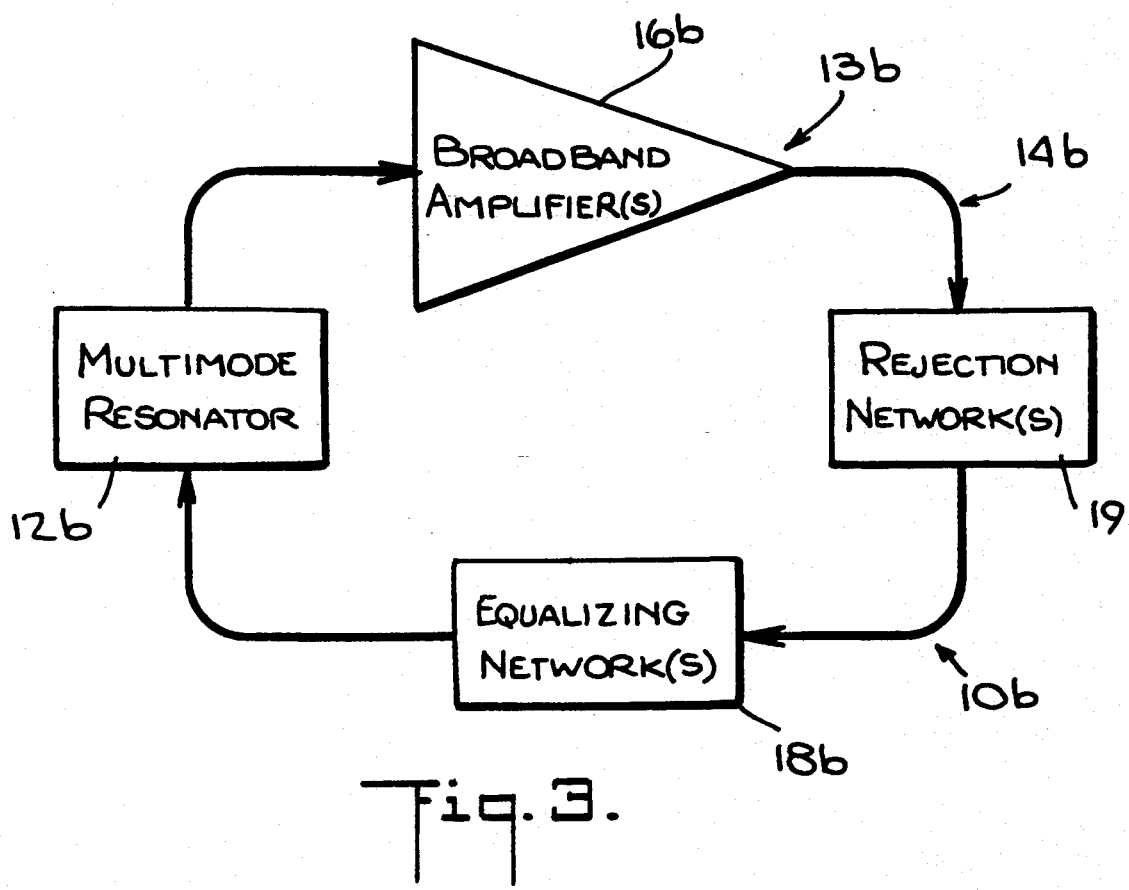
FIG. 3 is a block diagram of a dual mode oscillator according to another embodiment of the invention.

The control circuit 13 may include means for suppressing oscillations at unwanted frequencies. For example, control circuit 13 in FIG. 1 may include circuitry that suppresses unwanted oscillations or modes without using inductors. Alternatively, as depicted in FIG. 3, the feedback loop 14 of control circuit 13 may include one or more rejection networks 19 which prevent oscillation at unwanted frequencies (such as for example one of the "B" modes of resonance in the SC-cut type of perpendicular field quartz crystal resonator). Such rejection networks 19 are not active at the mode frequencies desired of the resonator or at the operating frequencies of the oscillator, and may comprise, in discrete or distributed form, in series and/or parallel, resistance, capacitance, inductance, and amplifier stage input and output impedances. Thus, such rejection networks 19 are inductorless at the desired frequencies of oscillation. Such networks are known or may be constructed by those of skill in the art.

The multimode resonator 10b depicted in FIG. 3 may utilize a perpendicular field SC-cut crystal resonator 12b and a control circuit 13b which includes circuitry similar to that shown in FIG. 2 plus one or more appropriate rejection networks 19.

Resonator 12, amplifier 16 and network 18 in FIG. 1, and resonator 12b, amplifier 16b, network 18b and network 19 in FIG. 3 may be coupled in any order in a positive-feedback loop that is simultaneously self-oscillating at the two modes of resonator 12 or 12b.

Figure 4:
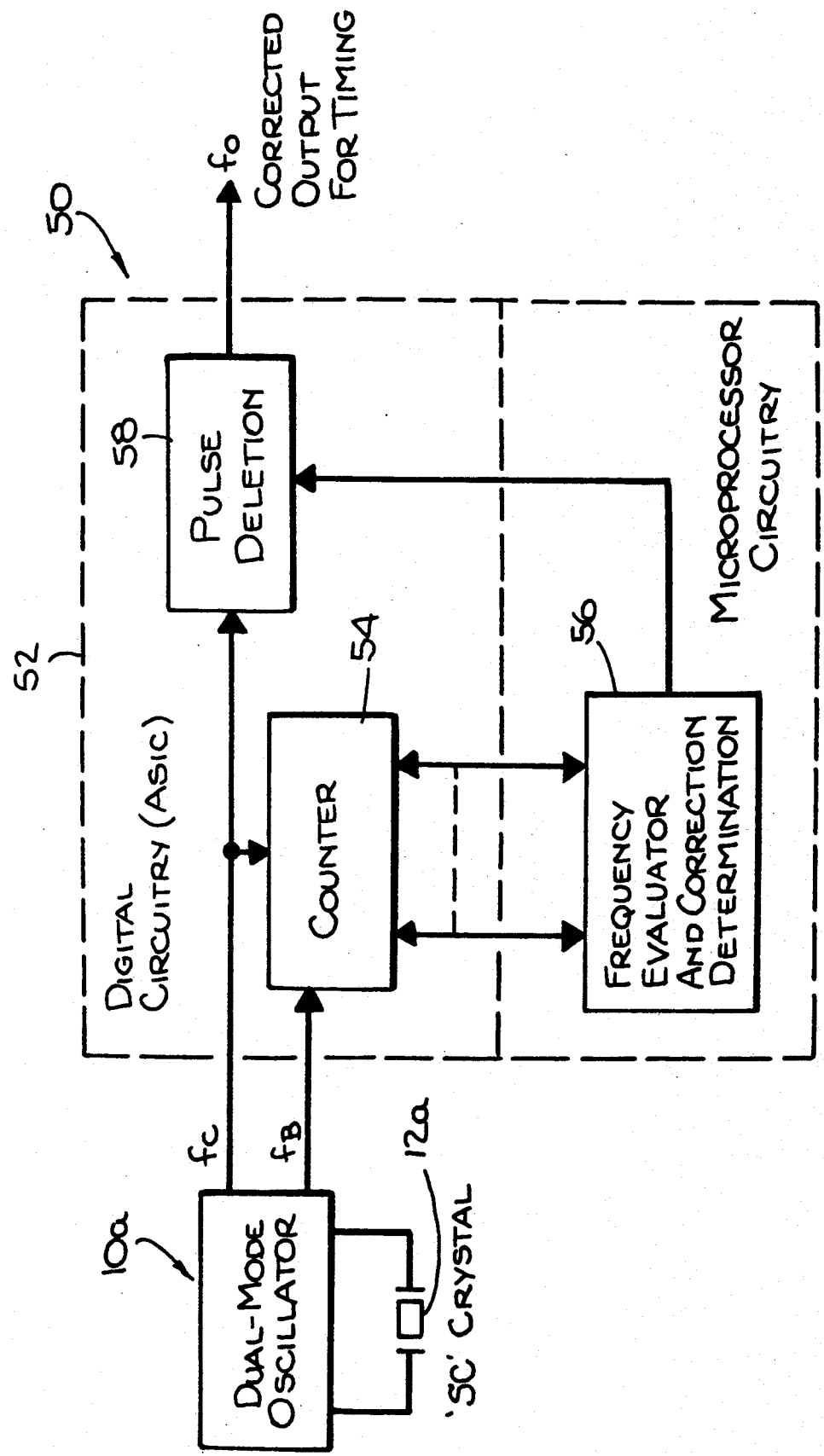
FIG. 4 is a block diagram of a microcomputer controlled dual mode oscillator employing a dual mode oscillator according to the invention.

In one application, dual mode oscillator 10a (or 10 or 10b) may form part of the microcomputer controlled oscillator (MCXO) 50 depicted in FIG. 4. The beat (third) frequency ("$f_B$") indicate the actual temperature of the resonator and is used to correct the frequency of the fundamental ("$f_{1c}$") or third overtone ("$f_{3c}$"), denoted simply as "$f_c$" in FIG. 4. The $f_B$ and $f_c$ signals are supplied to digital circuitry 52 which deletes pulses from the $f_c$ signal in accordance with the $f_B$ signal and frequency/temperature characteristics correlated with the $f_B$ signal and the crystal resonator 12a which is stored in microprocessor circuitry 56. The $f_B$ signal is counted in counter 54, with $f_{1c}$ or $f_{3c}$ as the interval timing reference. The count is applied to the microprocessor circuitry 56, which determines, based on this count and on the known stored frequency/temperature characteristics of the crystal, the number of pulses that must be deleted in each unit of time by pulse deletion circuit 58 to provide the temperature corrected signal $f_0$. The crystal oscillator frequency ($f_{1c}$ or $f_{3c}$) is selected so that, at all temperatures, it is always greater than the required output frequency. This ensures that pulses can always be deleted from the pulse train to provide the required number of pulses in each interval. Typical values are: $f_{1c}=3.38+$ MHz, $f_B=150$ kHz, and $f_0=3.38$ MHz. If the calculated correction includes a fraction of a pulse, the fractional value is stored in memory, and an additional pulse will be deleted when the memory, incremented in subsequent cycles, has reached or exceeded a full pulse.

Further description of MCXO 50 is contained in *Pro. 43rd Ann. Symp. on in Frequency Control*, pp 16-19, cited above.

Certain changes and modifications of the embodiments of the invention herein disclosed will be readily apparent to those of skill in the art. Moreover, uses of the invention other than in thermometry and instrumentation will also be readily apparent to those of skill in the art. It is the applicant's intention to cover by the claims all such uses and all those changes and modifications which could be made to the embodiments of the invention herein chosen for the purposes of disclosure which do not depart from the spirit and scope of the invention.

What is claimed is:

1. A multimode oscillator comprising:
   an SC-cut lateral field quartz crystal resonator capable of being excited in at least first and second C modes simultaneously while suppressing excitation in at least corresponding B modes;
   a circuit coupled to said resonator for exciting said resonator in said first and second C modes simultaneously, said circuit including elements coupled in a single gain feedback loop coupled to said resonator for causing said oscillator to oscillate at a first frequency corresponding to said first C mode and at a second frequency corresponding to said second C mode simultaneously;

either said resonator or said circuit suppressing oscillations at unwanted frequencies in modes other than said first and second C modes;

said circuit permitting substantially separate control of oscillations at said first frequency and at said second frequency.

2. A multimode oscillator comprising:

an SC-cut lateral field quartz crystal resonator capable of being excited in at least first and second C modes simultaneously while suppressing excitation in at least corresponding B modes;

a circuit coupled to said resonator for exciting said resonator in said first and second modes simultaneously, said circuit including elements coupled in a single gain feedback loop coupled to said resonator for causing said oscillator to oscillate at a first frequency corresponding to said first C mode and at a second frequency corresponding to said second C mode simultaneously, said elements not including an inductor;

said quartz crystal resonator and said circuit elements being selected such that unwanted modes of excitation and unwanted oscillations are suppressed while said oscillator oscillates at said first and second frequencies.

3. A multimode oscillator comprising:

an SC-cut lateral field quartz crystal resonator capable of being excited in at least first and second C modes simultaneously while suppressing excitation in at least B modes;

a circuit coupled to said resonator for exciting said resonator in said first and second C modes simultaneously, said circuit including elements coupled in a single gain feedback loop coupled to said resonator for causing said oscillator to oscillate at a first frequency corresponding to said first C mode and at a second frequency corresponding to said second C mode simultaneously;

either said resonator or said circuit suppressing oscillations at unwanted frequencies in modes other than said first and second C modes;

said elements allowing independent substantially separate control of the power of oscillation at said first frequency and said second frequency.

4. The multimode oscillator of claim 1, 2 or 3 wherein said elements coupled in said single gain feedback loop are selected to cause a signal at a third frequency to be generated from said oscillations at said first frequency and said second frequency, said oscillator providing as outputs said signal at said third frequency and at least one signal at one or both of said first frequency and said second frequency.

5. The multimode oscillator of claim 4 wherein said elements cause said oscillations at said first frequency and said second frequency to beat to provide said signal at said third frequency.

6. The multimode oscillator of claim 1 or 3 wherein said elements coupled in said single gain feedback loop do not include an inductor.

7. The multimode oscillator of claim 1, 2 or 3 wherein said elements coupled in said single gain feedback loop comprise a non-linear active element and a substantially linear amplifier.

8. The multimode oscillator of claim 1 or 3 wherein said loop is substantially inductorless at said first and second frequencies.

9. The multimode oscillator of claim 1 or 3 including one or more rejection networks for suppressing oscillations at unwanted frequencies in modes other than said first and second C modes.

10. The multimode oscillator of claim 9 wherein said one or more rejection networks are substantially inductorless at said first and second frequencies.

11. A multimode oscillator comprising:

an SC-cut lateral field quartz crystal resonator capable of being excited in at least first and second C modes simultaneously while suppressing excitation in at least corresponding B modes;

a circuit coupled to said resonator for exciting said resonator in said first and second C modes simultaneously, said circuit including elements selected and coupled in a single gain feedback loop coupled to said resonator for causing said oscillator to oscillate at a first frequency corresponding to said first C mode and at a second frequency corresponding to said second C mode simultaneously, said elements not including an inductor;

said quartz crystal resonator and said circuit elements being selected such that unwanted modes of excitation and unwanted oscillations are suppressed while said oscillator oscillates at said first and second frequencies;

said elements allowing substantially separate control of the power of oscillation at said first frequency and said second frequency, said circuit causing a signal at a third frequency to be generated from said oscillations at said first frequency and said second frequency, said oscillator providing as outputs said signal at said third frequency and at least one signal at one or both of said first frequency and said second frequency.

12. The multimode oscillator of claim 11 wherein said elements cause said oscillations at said first frequency and said second frequency to beat to provide said signal at said third frequency.

13. A multimode oscillator comprising:

a multimode resonator capable of being excited in first and second modes simultaneously;

a circuit coupled to said resonator for exciting said resonator in said first and second modes simultaneously, said circuit including elements coupled in a single gain feedback loop coupled to said resonator for causing said oscillator to oscillate at a first frequency corresponding to said first mode and at a second frequency corresponding to said second mode simultaneously, said elements including a non-linear active element and a substantially linear amplifier;

either said multimode resonator or said circuit suppressing oscillations at unwanted frequencies in modes other than said first and second modes;

said circuit permitting substantially separate control of oscillations at said first frequency and at said second frequency.

14. A multimode oscillator comprising:

a multimode resonator capable of being excited in first and second modes simultaneously;

a circuit coupled to said resonator for exciting said resonator in said first and second modes simultaneously, said circuit including elements coupled in a single gain feedback loop coupled to said resonator for causing said oscillator to oscillate at a first frequency corresponding to said first mode and at a second frequency corresponding to said second mode simultaneously, said elements including a non-linear active element and a substantially linear amplifier and not including an inductor.

15. A multimode oscillator comprising:
a multimode resonator capable of being excited in first and second modes simultaneously;
a circuit coupled to said resonator for exciting said resonator in said first and second modes simultaneously, said circuit including elements coupled in a single gain feedback loop coupled to said resonator for causing said oscillator to oscillate at a first frequency corresponding to said first mode and at a second frequency corresponding to said second mode simultaneously, said elements including a non-linear active element and a substantially linear amplifier;
either said multimode resonator or said circuit suppressing oscillations at unwanted frequencies in modes other than said first and second modes;
said elements allowing substantially separate control of the power of oscillation at said first frequency and said second frequency.

16. The multimode oscillator of claims 1, 2, 3 or 11, wherein said circuit excites said quartz crystal resonator in at least the fundamental and third overtone C modes and said quartz crystal resonator suppresses at least the fundamental and third overtone B modes.

* * * * *